United States Patent [19]
Goto et al.

[11] Patent Number: 4,467,025
[45] Date of Patent: Aug. 21, 1984

[54] PHOTOSENSITIVE COMPOSITIONS

[75] Inventors: Kiyoshi Goto, Hino; Hiroh Kawada, Itsukaichi; Noriyasu Kita, Musashimutayama, all of Japan

[73] Assignee: Konishiroku Photo Industry Co., Ltd., Tokyo, Japan

[21] Appl. No.: 466,719

[22] Filed: Feb. 15, 1983

Related U.S. Application Data

[63] Continuation of Ser. No. 248,301, Mar. 27, 1981, abandoned, which is a continuation of Ser. No. 90,869, Nov. 2, 1979, abandoned.

[30] Foreign Application Priority Data

Nov. 2, 1978 [JP] Japan .................. 53-136208

[51] Int. Cl.³ .............................................. G03C 1/52
[52] U.S. Cl. .................................. 430/191; 430/193; 430/292; 260/141; 260/146 D
[58] Field of Search .................. 260/141 R, 141 D; 430/191, 193, 292

[56] References Cited

U.S. PATENT DOCUMENTS 3,046,121  7/1962  Schmidt ........................ 430/191
3,201,239  8/1965  Neugebauer et al. ......... 430/191
3,969,118  7/1976  Stahlhofen et al. ........... 430/191

Primary Examiner—Jack P. Brammer
Attorney, Agent, or Firm—Jordan B. Bierman; Linda Bierman

[57] ABSTRACT

A photosensitive composition containing an o-naphthoquinonediazido compound of Formula I

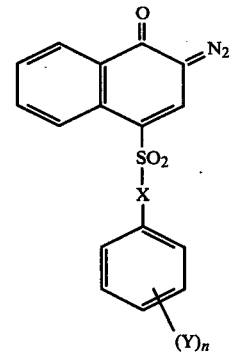

wherein X is an oxy or amino group, Y is a cyano or nitro group, and n is an integer of 2 to 5, and an organic dye capable of changing its color when the photosensitive composition is exposed.

9 Claims, No Drawings

PHOTOSENSITIVE COMPOSITIONS

This Application is a continuation application of Ser. No. 248,301, filed Mar. 27, 1981 now abandoned which is a continuation of Ser. No. 090,869, filed Nov. 2, 1979, now abandoned which in turn claims priority of Japanese Application No. 136208/1978 filed on Nov. 2, 1978.

This invention relates to photosensitive compositions suitable for use in the preparation of lithographic printing plates, letterpress printing plates, IC circuits or photomasks and more particularly to photosensitive compositions which are so designed that visible images can be obtained immediately after exposure by virtue of using combinations or certain o-naphthoquinonediazide compounds and certain organic dyes in said compositions.

It is well known to use, as photosensitive compositions which form photoresists, compounds of ester or amide of o-naphthoquinonediazidosulfonic acid. Because of extremely excellent efficiencies, these compounds are being widely used on an industrial scale for the preparation of lithographic printing plates, especially the so-called presensitized plates (hereinafter called "PS plates") comprising a support and a layer of photosensitive composition having been previously formed thereon, or they are being extensively used in the industries as photoresists for letterpress printing plates, IC circuits, photomasks or printed circuits. Photosensitive compositions having contained therein these compounds, however, have such drawbacks as mentioned hereinafter.

That is, these compounds which show a yellow color per se, come to fade and become a colorless or pale yellow photolysis component on exposure. Accordingly, in the exposure operation under a yellow safty lamp, the operator can not distinguish exposure areas from unexposed areas after the exposure. On this account, mishandling such as multiple exposure occurs in the course of such an exposing operation so-called "multiple operation", where an original is placed on a part of plate and exposed, and then is replaced on another part of the plate successively, or an operation where an unwanted image is removed by exposure.

Some attempts have heretofore been made so as to form visible images immediately after exposure of photosensitive compositions in order to obviate these drawbacks mentioned above.

Such attempts so as to obtain a visible image include, for example, the use of reducible salts of varied types in admixture with diazo compounds as disclosed in U.S. Pat. Nos. 2,066,913 and 2,618,555; the use of photosensitive diazo substances in combination with acidbase indicators as disclosed in Japanese Patent Publication No. 2203/1965; the use of combinations of diazo resins and merocyanine dyes as disclosed in Japanese Patent Publication No. 3041/1974; the use of homogeneously pulverized organic coloring matters capable of changing color at pH 2.5–6.6 as disclosed in Japanese Patent Publication No. 21093/1965; the use of esters of amides of o-naphthoquinonediazidosulfonic acid, o-naphthoquinonediazido-4-sulfonic acid halogenide and a salt-forming organic compound as a dye as disclosed in Japanese Laid-Open-to-Public Publication No. 36209/1975; and photosoluble compositions comprising o-naphthoquinonediazide compounds, novolak resins and cyclic acid anhydrides, o-naphthoquinonediazido-4-sulfonic acid halogenide and an organic dye capable of changing its color tone on interaction with a photolysis product of the o-naphthoquinonediazido-4-sulfonic acid halogenide.

In the attempt thus improved, however, visible images obtained by means of exposure are not found to be sufficient in their contrast in the course of actual operation under a yellow safety lamp, and no improvement is brought about to such an extent that the aforesaid exposing operation can be carried out without trouble. Even in the case where sufficient contrast has been obtained, an adverse influence is exerted on sensitivity or developability, or when the compositions have been stored for a long period of time images with sufficient contrast can not be obtained, and thus the compositions have not been improved yet to demonstrate satisfactory efficiencies.

An object of the present invention is to provide photosensitive compositions, from which such drawbacks of the prior art have been eliminated so that visible images sufficient in contrast can be obtained immediately after exposure, the properties of which suffering from no change even after a long storage and exerting no adverse influence on efficiencies of photosensitive compositions inherently required for, such as sensitivity, developability, etc.

After extensive researches, the present inventors propose a photosensitive composition containing an o-naphthoquinonediazide compound represented by the following general formula (which will be called the o-naphthoquinonediazide compound of the present invention).

General formula:

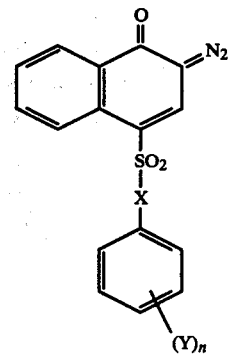

wherein X represents an oxy (—O—) or amino (=NH$_2$) group; Y represents an electron attractive substituent; and n is an integer of 1 to 5.

The aforesaid o-naphthoquinonediazide compounds of the present invention are characterized by having in the molecular structure at least one electron attractive substituent represented by Y in the aforesaid general formula, and the presence of the substituent greatly contributes to the efficiency of visible image obtained after exposure, to which the object of the present invention is directed. That is, in case where any compound having no substituent as referred to above or having substituents which are electron donative groups, no visible image is obtained or even when visible images are obtained more or less, they are of no practical value, whereas when the o-naphthoquinonediazide compounds having electron attractive substituents are used, visible images can be obtained, giving a satisfactory contrast sufficient to carry out the aforesaid operation without any difficulty. A preferable example of the electron attractive substituent is a fluorine, chlorine or bromine atom, a nitro, cyano, vinyl, carbamoyl, —COOR$_1$, —COR$_2$ or —SO$_3$R$_3$ in which R$_1$, R$_2$ and R$_3$ individually represent a lower alkyl group (e.g. methyl, ethyl, propyl, butyl, t-butyl), aryl group (e.g. phenyl, naphthyl) or aralkyl group (e.g. benzyl), preferably the lower alkyl group has 1 to 4 carbon atoms and the aryl and aralkyl groups individually have 6 to 10 carbon atoms.

These electron attractive substituents may be located at any of the o-, m- and p-positions with respect to, but the effect obtainable by the use of the compound having the substituents at the o- or p-position is generally greater than that obtainable by the case of the m-position, and the number of the substituents amounting to 1 to 3 may be preferable, but the effect obtainable by the use of the disubstitution or trisubstitution compound is greater than that of the monosubstitution compund. A more preferable example of an electron attractive substituent is a nitro or cyano group.

The naphthoquinone nuclei of the o-naphthoquinonediazide compounds may have a substituent.

Typical examples of the o-naphthoquinonediazide compounds of the present invention may be exemplified below, though there are included in the scope of the present compound such as having varying combinations according to the kind, number and substitution position of the electron attractive groups and to the linking group X as selected.

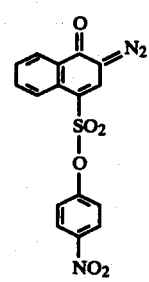
(1)

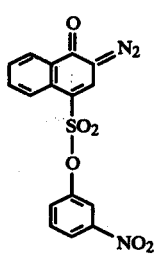
(2)

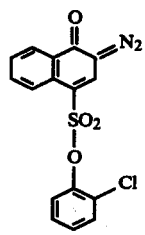
(3)

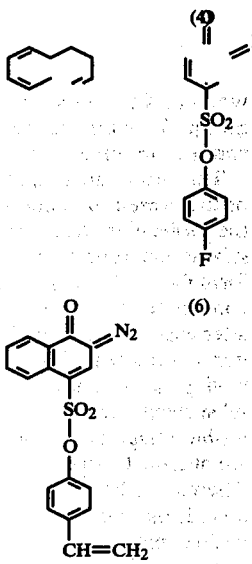
(4)

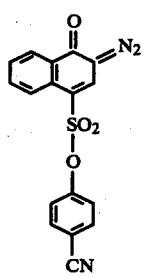
(5)

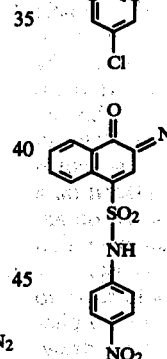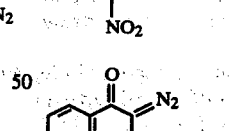
(6)

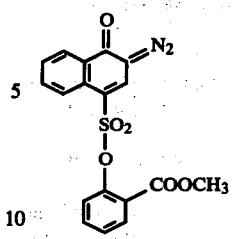
(7)

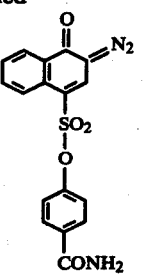
(8)

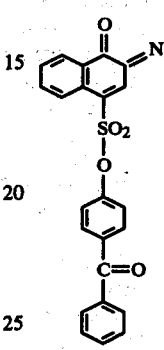
(9)

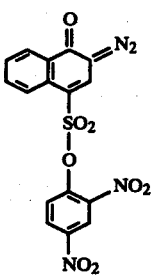
(10)

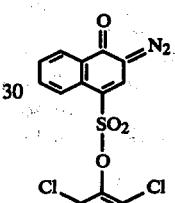
(11)

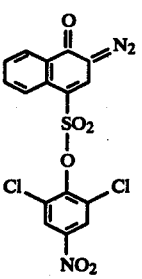
(12)

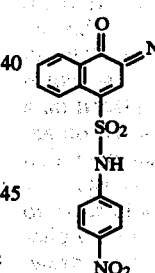
(13)

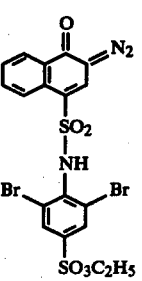
(14)

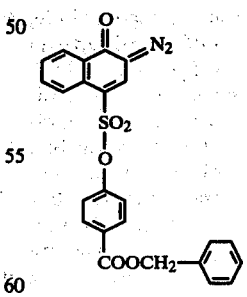
(15)

The o-naphthoquinonediazide compound of the present invention can be prepared according to a procedure similar to the under-mentioned common process for the synthesis of the prior art o-naphthoquinonediazide compounds, per se, known.

That is, the present o-naphthoquinonediazide compounds are readily prepared by dissolving naphthoquinone-(1,2)-diazido-(2)-4-sulfonyl chloride and phenols or anilines having the aforesaid electron attractive substituents in dioxane or tetrahydrofuran, followed by dropwise addition thereto of an aqueous solution of alkali such as sodium carbonate or potassium carbonate.

The o-naphthoquinonediazide compounds thus prepared and used in the present invention withstand a long term storage and do not show such inconvenient properties for photosensitive substances, as hydroscopicity, liability to decomposition if they are stored in the dark place.

The o-naphthoquinonediazide compound of the present invention is used to prepare a photosensitive composition in combination with an organic dye capable of changing its color when the photosensitive composition is exposed. Changing color includes a fading out of color or a changing color tone etc. The organic dye is thought to change its color on an interaction (for example, a weak chemical reaction) with a photolysis product of the said o-naphthoquinonediazide compound caused by an exposure.

The organic dyes include triphenylmethane dyes, for example, basic triphenylmethane dyes such as Victoria Pure Blue BOH (produced by Hodogaya Kagaku K.K.), Patent Pure Blue (produced by Sumitomo Mikuni Kagaku K.K.), Sudan Blue II (produced by BASF), Crystal Violet, Marachite Green, Fuchsine, etc., and acidic triphenylmethane dyes such as Gresol Red, Thymol Blue, etc., and in addition thereto further include oil soluble dyes such as Oil Blue #603 and Oil Red 5B (both produced by Orient Kagaku Kogyo K.K.), etc. Of the organic dyes mentioned above, basic triphenylmethane dyes are particularly preferable. Some of these dyes are well known in the prior arts above-mentioned.

The above-mentioned dyes may be used either singly or, if necessary, in the form of mixture thereof.

The present invention relates to photosensitive compositions comprising at least one of the o-naphthoquinonediazide compounds of the present invention and the above-mentioned organic dye or dyes. The present photosensitive compositions, however, may be incorporated with other substances of various kinds for the purpose of improving film forming property, mechanical strength and photographic efficiency. First, the present photosensitive compositions can contain, as photosensitive substance, the prior art o-naphthoquinonediazide compounds, per se, known. Preferably known o-naphthoquinonediazide compounds for the above purpose are esters of naphthoquinone-(1,2)-diazido-(2)-sulfonic acid chloride with phenol or cresol-formaldehyde resins. Other useful o-naphthoquinonediazide compounds, per se, known include those as disclosed, for example, in the Japanese Patent Publication Nos. 5083/1975, 5084/1975, 483/1976, 24641/1975, 34934/1977, 34932/1977 and 36008/1977.

The photosensitive compositions can further be incorporated with non-photosensitive resins with the view of improving film forming property, mechanical strength, resistance to chemicals, etc.

The non-photosensitive resins effectively usable for this purpose, either singly or in combination, may include, for example, alkali soluble resins, for example, phenol or formaldehyde novolak resins, m-cresol formaldehyde novolak resins, m-xylenol formaldehyde novolak resins, shellac, rosin, polyacrylic acid, polymethacrylic acid, methacrylic acid methyl methacrylate copolymers, methacrylic acid styrene copolymers, poly-p-hydroxystyrene, copolymers containing p-hydroxymethacrylanilide derivatives as disclosed in the Japanese Patent Publication No. 34931/1977 and copolymers containing p-hydroxymethacrylate derivatives as disclosed in the Japanese Patent Publication No. 41052/1977.

Besides the above-mentioned additives, the present photosensitive compositions may be incorporated with various additives according to various purposes. For instance, the compositions may contain, for the purpose of improving their coating properties, such additives, for example, as cellulose alkyl esters, ethylene oxide type surface active agents and fluorine-containing type surface active agents (e.g. FC-430 and FC-431 produced by Minesota Mining and Manufacturing Co., Ltd.) and further, for the purpose of improving physical properties of the resulting coatings of the composition, such plasticizers, for example, as dibutyl phthalate, butyl glycolate, tricresyl phosphate, dioctyl adipate, etc.

In the present photosensitive composition which contain such components as mentioned above, no particular limitation is placed on mixing ratio of these components. However, there are used the present o-naphthoquinonediazide compound of the aforesaid general formula in an amount, by weight, based on the total amount of the composition, of 0.1–70%, preferably 1–40%, the organic dye capable of changing its color tone on interaction with a photolysis product of said o-naphthoquinonediazide compound in an amount, based on the total amount of the composition, of 0.1–20%, preferably 0.5–5%, and the additives in an amount, based on the total amount of the composition, of 0.01–20%, preferably 0.05–10%, though the amount of said additives may vary, in general, depending on the kind of the additives used.

The photosensitive compositions of the present invention are applied to a variety of uses after coating on a suitable support such as aluminum plate, zinc plate, copper plate, plastic film, paper, and laminated plates, for example, bimetals, trimetals, copper foils for printed circuit, plastic sheets, chromium oxide-evaporated glass sheets, etc. In a coating liquid used for coating the present photosensitive composition on the support, a concentration of total solids of the composition is desirably 1–50% by weight based on an organic solvent in the coating liquid. The organic solvents suitably used, either singly or in the form of mixture thereof, in the coating liquid are methyl cellosolve, ethyl cellosolve, dioxane, acetone, γ-butyrolactone, tetrachloroethane, tetrahydrofuran, dimethylsulfoxide, dimethylformamide, methyl cellosolve acetate and ethyl cellosolve acetate.

When using the photosensitive materials thus obtained, any process conventionally used for materials of this kind is applicable. For instance, a transparent original bearing thereon a line image, dot image or the like is brought into close contact with a photosensitive surface of the material, followed by exposure and development with an aqueous alkali solution, thereby obtaining a positive type relief image relative to the original. Preferably usable sources of light for exposure include a mercury lamp, metal halide lamp, xenon lamp, carbon arc lamp, etc. The aqueous alkali solution for use in development includes an aqueous solution of sodium hydroxide, potassium hydroxide, sodium carbonate, potassium carbonate, sodium silicate, sodium metasilicate, disodium hydrogen phosphate, trisodium hydrogen phosphate, etc. A concentration of the aqueous alkali solution used in that case is generally 0.1–10% by weight, though the concentration may vary according to the kind of the photosensitive composition and of the alkali used. In order to accelerate development and inhibit uneven development, the aqueous alkali solution used may be incorporated with a small amount of a surface active agent, an organic solvent miscible with water and the like additives suitable for these purposes.

The present invention is more fully illustrated below with reference to examples, but it should be construed that embodiments of the invention are not limited only to those examples.

EXAMPLE 1

On an aluminum sheet of 0.24 mm in thickness grained by brush polishing technique, was coated by means of a rotary coating machine a photosensitive liquid of the following composition and then dried at 110° C. for 3 minutes to obtain a printing plate for lithography.

Composition of photosensitive liquid:

| | |
|---|---|
| Naphthoquinone-(1,2)-diazido-(2)-4-sulfonic acid-2,4-dinitrophenyl ester (exemplified compound 10) | 1.4 g |
| m-Cresol formaldehyde novolak resin (MP-707 produced by Gunei Kagaku K.K.) | 7.6 g |
| Condensate of naphthoquinone-(1,2)-diazido-(2)-5-sulfonic acid chloride with m-cresol formaldehyde novolak resin (condensation rate: 25 mol %) | 5.0 g |
| Victoria Pure Blue BOH produced by Hodogaya Kagaku K.K.) C.I. No. 42595 | 0.1 g |
| Tricresyl phosphate | 0.14 g |
| Ethyl cellosolve | 100 g |

After drying, the photosensitive layer thus formed on the aluminum sheet had a weight of 2.78 g/m².

On the thus obtained photosensitive printing plate for lithograpy were brought into close contact with the photosensitive layer a positive copy of halftone photograph and a step tablet for sensitivity measurement and then exposed for 70 seconds at a distance of 1 meter from a 2 KW metal halide lamp. Immediately after the exposure, the dye in the exposed portion of photosensitive layer faded and a clear distinction in color tone between the exposed and unexposed portions was observed. The visible image thus obtained was such that even register marks of the copy could be visualized.

Subsequently, the exposed printing plate was subjected to vat development with a 4% aqueous sodium metasilicate solution at 25° C. for 45 seconds, whereupon the portion faded by exposure was removed after having been dissolved, and a blue positive relief image excellent in affinity for printing ink. When an offset press fitted with the thus obtained printing plate was set in motion, copies of printed matter bearing a favorable image thereon were obtained.

Furthermore, the present example was compared in respect of efficiency of the visible image obtained immediately after exposure, that of the visible image obtained after exposure but after a certain lapse of time, and stability of sensitivity of the photosensitive printing plate as prepared and stored under certain conditions, with comparative examples involving systems different from that of the present example to obtain the results as shown in Tables 1 and 2, said comparative examples involving ① the same system as in the present example but without addition thereto of the o-naphthoquinonediazide compound of the present invention (Comparative Example 1), ② the same system as in the present example but using an o-naphthoquinonediazide compound having an electron donative group in place of the present o-naphthoquinonediazide compound (Comparative Example 2) and ③ the same system as in the present example but using naphthoquinone-(1,2)-diazido-(2)-4-sulfonic acid chloride instead of the present o-naphthoquinonediazide compound.

The comparison of efficiencies of the visual images obtained after exposure was made by measurement (using a yellow filter) of reflection densities of the exposed and unexposed portions and by visual observation of the images under a yellow lamp, and the comparison of sensitivities of the photosensitive plates was made by measurement of the exposure time required for making completely clear the third step of a step tablet No. 2 manufactured by Eastman Kodak Co. under the same exposure conditions as in the present example.

COMPARATIVE EXAMPLE 1

Example 1 was repeated except that the exemplified compound 10 was not added to the photosensitive liquid.

COMPARATIVE EXAMPLE 2

Example 1 was repeated except that naphthoquinone-(1,2)-diazido-(2)-4-sulfonic acid-2,4-dimethylphenyl ester of the following formula was in place of, and in the same amount as that of, the exemplified compound 10 in the photosensitive liquid.

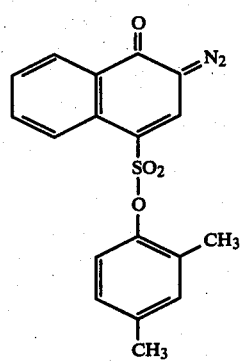

COMPARATIVE EXAMPLE 3

Example 1 was repeated except that naphthoquinone-(1,2)-diazido-(2)-4-sulfonic acid chloride (disclosed in Japanese Laid-Open-to-Public Publn. No. 36209/1975) was used in place of, and in the same amount as that of, the exemplified compound 10 in the photosensitive liquid.

TABLE 1

Comparison in efficiency between visible images obtained after exposure as well as in storage stability between photosensitive compositions on storage

| Composition prescribed | On the spot | | | Stored in dry thermostat 55° C., 2%, for 6 days | | | Stored in hydrothermostat 40° C., 80%, for 6 days | | |
|---|---|---|---|---|---|---|---|---|---|
| | Density | | Difference observed by visual observation | Density | | Difference observed by visual observation | Density | | Difference observed by visual observation |
| | Exposed portion | Unexposed portion | | Exposed portion | Unexposed portion | | Exposed portion | Unexposed portion | |
| Example 1 | 0.50 | 0.75 | O | 0.55 | 0.74 | O | 0.58 | 0.74 | O |
| Comparative Example 1 | 0.74 | 0.75 | X | 0.71 | 0.73 | X | 0.73 | 0.74 | X |
| Comparative Example 2 | 0.75 | 0.77 | X | 0.74 | 0.75 | X | 0.74 | 0.74 | X |
| Comparative Example 3 | 0.47 | 0.74 | O | 0.57 | 0.65 | Δ | 0.67 | 0.69 | X |

(Remarks)
The result of visual observation of a difference in density between the exposed and unexposed portions of the image formed after exposure was represented by the sign O wherein a clear difference was observed, the sign Δ wherein a difference observed was somewhat not clear, and the sign X wherein a difference was not clear.

TABLE 2

Comparison in sensitivity between photosensitive compositions on storage

| Composition prescribed | On the spot | Stored in dry thermostat 55° C., 2%, for 6 days | Stored in hydrothermostat 40° C., 80%, for 6 days |
|---|---|---|---|
| Example 1 | 70 sec. | 76 sec. | 76 sec. |
| Comparative Example 1 | 59 sec. | 64 sec. | 64 sec. |
| Comparative Example 2 | 70 sec. | 76 sec. | 76 sec. |
| Comparative Example 3 | 91 sec. | 108 sec. | 128 sec. |

The time in the table represents an exposure time required for clearing the third step of the step tablet under irradiation with light from a 2 KW metal halide lamp at the distance of 1 meter.

As is clear from Table 1, in Comparative Example 1 using no o-naphthoquinonediazide compound of the present invention as well as in Comparative Example 2 using instead the o-naphthoquinonediazide compound having electron donative substituents, no difference in density between the exposed and unexposed portions of the image as obtained is observed or, if there is any, it is very small, and the difference cannot be actually detected at all under a yellow lamp. In another visible image system (Comparative Example 3) using instead the naphthoquinone-(1,2)-diazido-(2)-4-sulfonic acid, on the one hand, a visible image is obtained at least from the photosensitive plate before storing, but no visible image with practical usefulness can be obtained after storing the plate under the circumstances of high temperature or humidity since marked deterioration in efficiency of the stored plate is brought about and, moreover, deterioration in sensitivity is also brought about as can be seen from Table 2.

In contradistinction thereto, a visible image with sufficient density difference and contrast can be obtained in Example 1 using the photosensitive composition of the present invention in both cases before and after storage, and no practical deterioration in sensitivity is brought about.

In Examples 3 to 4 as conducted, there were obtained sharply printed out images by exposing photosensitive materials obtained in the manner similar to that of Example 1 and the photosensitive materials were found to have favorable storage stability comparable to that of Example 1. Consequently, Examples 3 to 4 are given below by merely referring to photosensitive liquids respectively used therein.

EXAMPLE 2

Composition of photosensitive liquid:

| | |
|---|---|
| Naphthoquinone-(1,2)-diazido-(2)-4-sulfonic acid-2,6-chloro-4-nitrophenyl ester (Exemplified compound 12) | 5.9 g |
| m-Cresol formaldehyde novolak resin (MP-707 produced by Gunei Kagaku K.K.) | 9.0 g |
| Crystal Violet | 0.2 g |
| Ethylcellulose | 0.15 g |
| Methyl cellosolve | 100 g |

EXAMPLE 3

Composition of photosensitive liquid:

| | |
|---|---|
| Naphthoquinone-(1,2)-diazido-(2)-4-sulfonic acid-p-cyanophenyl ester (Exemplified compound 5) | 0.5 g |
| m- and p-Cresol mixture formaldehyde novolak resin (MP-703 produced by Gunei Kagaku K.K.) | 11.8 g |
| Condensate (condensation rate: 33 mol %) of naphthoquinone-(1,2)-diazido-(2)-5-sulfonic acid chloride with phenol formaldehyde novolak resin | 7.7 g |
| Patent Pure Blue (produced by Mikuni Kagaku K.K.) | 0.28 g |
| Dibutyl phthalate | 0.2 g |
| Ethyl cellosolve acetate | 100 g |

EXAMPLE 4

Composition of photosensitive liquid:

| | |
|---|---|
| Naphthoquinone-(1,2)-diazido-(2)-4-sulfonic acid-p-nitroanilide (Exemplified compound 13) | 0.2 g |
| Condensate of naphthoquinone-(1,2)-diazido-(2)-5-sulfonic acid chloride with polyhydroquinone monomethacrylate resin (condensation rate: 80 mol %, disclosed in Japanese Patent Publn. No. 34934/1977) | 9.8 g |
| Thymol Blue | 0.1 g |
| Cyclohexanone | 50 g |

| -continued | |
|---|---|
| Methyl cellosolve | 50 g |

What we claim is:

1. A photosensitive composition comprising a first o-naphthoquinone diazido compound represented by the following general formula

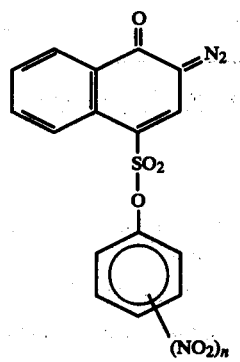

wherein n is an integer of 2–5, in an effective amount up to 40% by weight based on said composition, a triphenylmethane dye in an amount of 0.5 to 5% by weight, and an alkali soluble, non-photosensitive resin.

2. The composition of claim 1 wherein said o-naphthoquinone diazido compound is present in an amount of at least 1% by weight based on said composition.

3. A photosensitive composition according to claim 1 wherein said first o-naphthoquinonediazido compound is represented by the following formula;

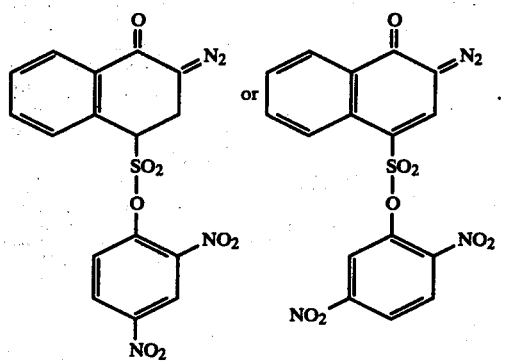

4. A composition according to claim 1 wherein n is 2 or 3.

5. The photosensitive composition of claim 1 wherein said non-photosensitive resin is selected from the group consisting of m-cresolformaldehyde novolak resins, shellac, rosin, polyacrylic acid, polymethacrylic acid, methacrylic acid methylmethacrylate copolymer, methacrylic acid styrene copolymers, and poly-p-hydroxystyrene.

6. A photosensitive composition according to claim 1 further containing a second o-naphthoquinonediazido compound other than said first o-naphthoquinondiazido.

7. A photosensitive composition according to claim 6 wherein said second o-naphthoquinonediazido compound is one selected from the group consisting of esters of naphthoquinone-(1,2)-diazido-(2)-sulfonic acid chloride with phenol- or cresol-formaldehyde resin.

8. A photosensitive material comprising a support and the photosensitive composition of claim 1 coated thereon.

9. The photosensitive material of claim 8 wherein said non-photosensitive resin is selected from the group consisting of m-cresolformaldehyde novolak resins, m-xylenol formaldehyde novolak resins, shellac, rosin, polyacrylic acid, polymethacrylic acid, methacrylic acid-methylmethacrylate copolymers, methacrylic acid-styrene copolymers, and poly-p-hydroxystyrene.

* * * * *